United States Patent [19]

Funatsu

[11] Patent Number: 4,747,102
[45] Date of Patent: May 24, 1988

[54] METHOD OF CONTROLLING A LOGICAL SIMULATION AT A HIGH SPEED

[75] Inventor: Shigehiro Funatsu, Tokyo, Japan

[73] Assignee: NEC Corporation, Tokyo, Japan

[21] Appl. No.: 845,244

[22] Filed: Mar. 28, 1986

[30] Foreign Application Priority Data

Mar. 30, 1985 [JP] Japan .................................. 60-64973

[51] Int. Cl.[4] ...................... G01R 31/28; G06F 11/00
[52] U.S. Cl. ........................................ 371/23; 371/25;
371/27; 324/73 AT; 324/73 R
[58] Field of Search ............................. 371/23, 25, 27;
324/73 AT, 73 R; 364/200, 900

[56] References Cited

U.S. PATENT DOCUMENTS 4,298,980  11/1981  Hajda .................................... 371/25
4,519,078   5/1985  Komonytsky ........................ 371/25
4,554,664  11/1985  Schultz ................................ 371/25

Primary Examiner—Michael R. Fleming
Attorney, Agent, or Firm—Foley & Lardner, Schwartz, Jeffery, Schwaab, Mack, Blumenthal & Evans

[57] ABSTRACT

In a method of controlling a logical simulation of a logic circuit comprising a plurality of logic elements which can be simulated by forming a shift register string, the logical simulation is carried out without serial shift operation of the shift register string on setting shift-in signals into the shift register string and/or on extracting internal states from the shift register string. Setting of the shift-in signals and extraction of the internal states are possible by monitoring a simulation table which has a plurality of addresses for the logic elements.

5 Claims, 5 Drawing Sheets

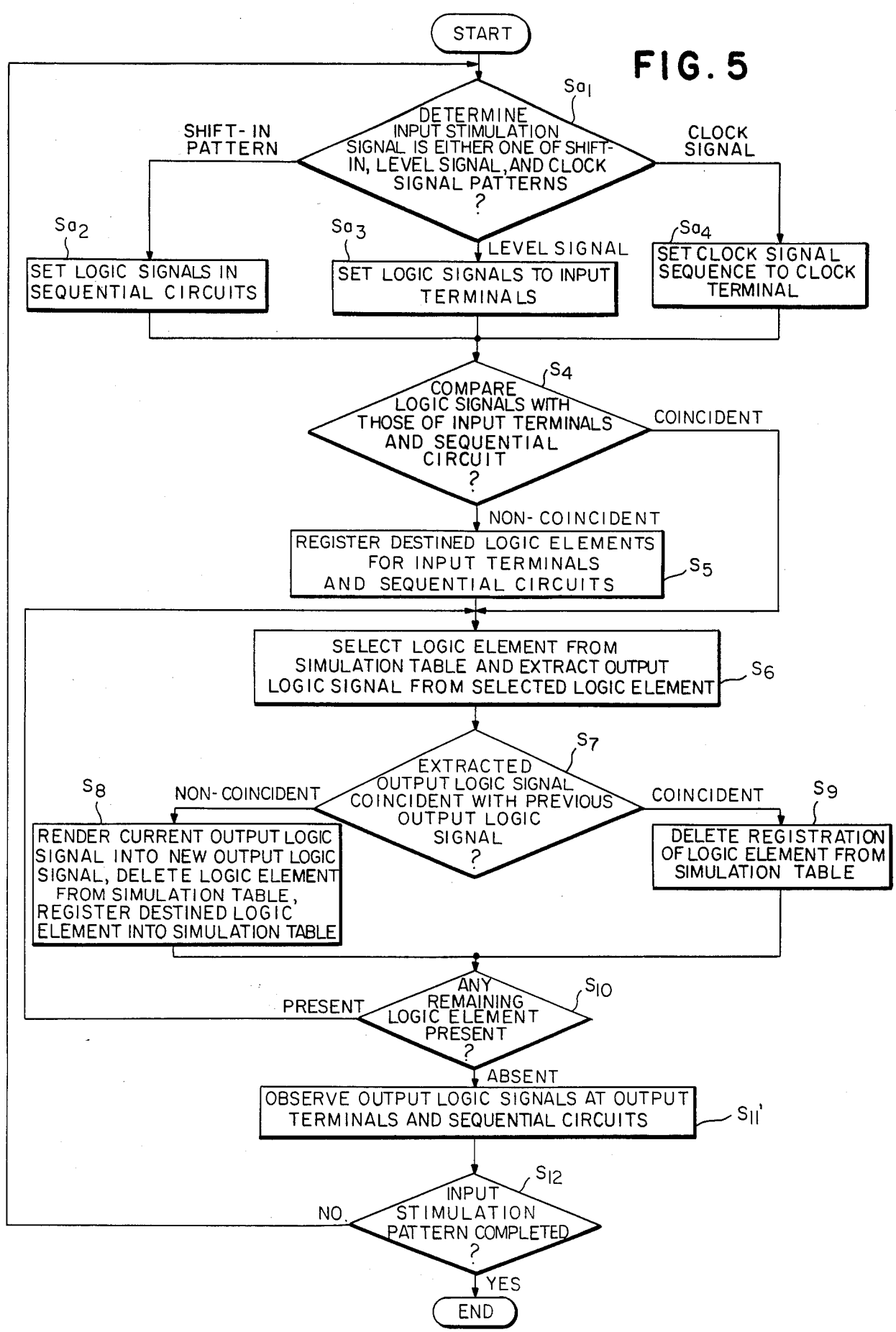

METHOD OF CONTROLLING A LOGICAL SIMULATION AT A HIGH SPEED

BACKGROUND OF THE INVENTION

This invention relates to a method of controlling a logical simulation of a logic circuit in response to an input stimulation signal. It is to be noted here that such a logical simulation is carried out in a simulator, namely, a computer by the use of the logic circuit logically formed therein and that a logic circuit may be distinguished from an actual or hardware logic circuit for convenience of description.

A logical simulation of the type described is used to assure operation of logical behavior of a hardware logic circuit or to evaluate the quality of a test pattern for testing a manufactured hardware logic circuit. The logical simulation may be carried out by the use of software, firmware, or hardware.

In general, the logical simulation is controlled by a control method which is applicable to any other logical simulation. As will later be described with reference to one figure of the accompanying drawing, such a control method is intended to put the logic circuit into operation in a manner similar to the hardware logic circuit. In other words, operation of the hardware logic circuit is faithfully reproduced or simulated by the logical simulation of the logic circuit.

In an article contributed by Funatsu et al to the Proceedings of 12th Design Automation Conference, page 114—page 122 (June 1975), and entitled "Test Generation Systems in Japan", a proposal is made about a simulation method of simulating a hardware logic circuit by making a plurality of sequential circuits, such as registers or flip flops, form a scan-path or a shift register string. The simulating method facilitates testing the hardware logic circuit because formation of the shift register string serves to readily load the sequential circuits with logic signals and to readily observe internal states of the sequential circuits. Thus, the above-mentioned hardware logic circuit will be called a hardware logic circuit of a scan-path type.

When the above-described control method is used to control a logical simulation of a specific logic circuit related to the scan-path type of the hardware logic circuit, a serial shift operation should inevitably be controlled to load a shift register string with a sequence of logic signals in synchronism with a sequence of clock signals and to read internal states out of the shift register string like in the hardware logic circuit. A long time is wasted by such a serial shift operation.

It is accordingly difficult to carry out, by the use of the above-mentioned control method, the logical simulation of the scan-path type of the hardware logic circuit at a high speed.

SUMMARY OF THE INVENTION

It is an object of this invention to provide a method which can control a logical simulation of a logic circuit at a high speed even when a logic circuit comprises a plurality of sequential circuits.

It is another object of this invention to provide a method of the type described, which is applicable to the logic circuit which can form a scan-path or shift register, string therein.

The method of the invention is for use in controlling a logical simulation of a logic circuit comprising a plurality of logic elements which can be simulated by forming a shift register string and by putting the shift register string into a serial shift operation, so as to evaluate the logic circuit. The method comprises the steps of providing an input stimulation signal for accessing the logic circuit to carry out the logical simulation and controlling operation of the logic elements without the serial shift operation with reference to the input stimulation signal to make the logic circuit carry out the logical simulation.

BRIEF DESCRIPTION OF THE DRAWING

FIG. 5 shows a flow chart for use in describing a control method according to a second embodiment of this invention.

DESCRIPTION OF THE PREFERRED EMBODIMENTS

Figure 1:
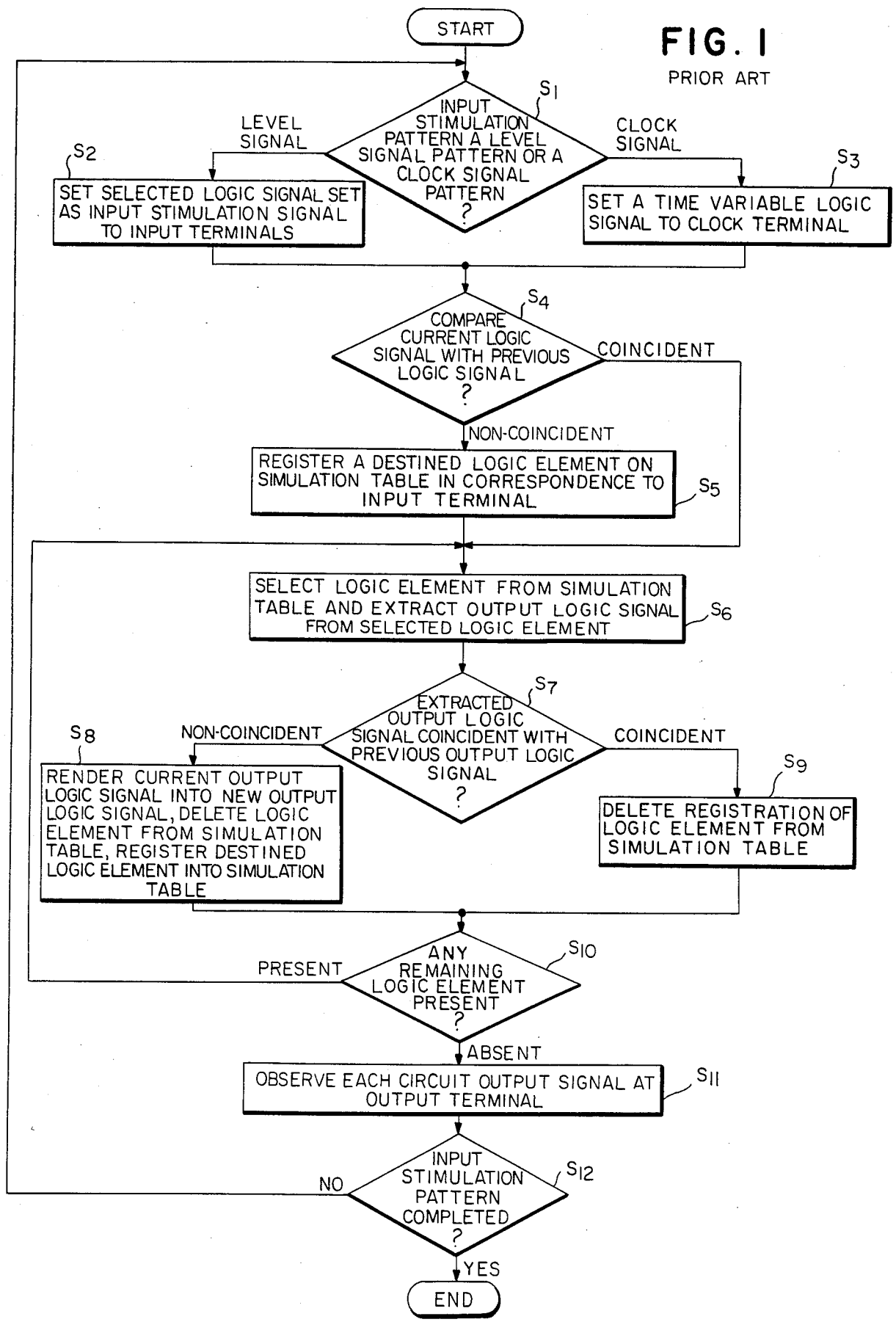
FIG. 1 shows a flow chart for use in describing a conventional control method of controlling a logical simulation.

Referring to FIG. 1, description is made of a conventional control method of controlling a logical simulation of a logic circuit in order to facilitate an understanding of this invention. It is to be noted here that the logic circuit has an input terminal set, an output terminal set, and a clock terminal, and comprises a plurality of combinational circuits, such as AND gates and/or OR gates, and a plurality of sequential circuits, such as flip flops and/or registers. Such a logic circuit is expressed by software. In addition, a memory of a simulator is loaded with a simulation table related to logic elements included in the logic circuit.

The logic circuit is given an input stimulation pattern which is divisible into a clock pattern of clock signals and a level signal pattern of level signals. The clock signals are varied or repeated within each clock period while each level signal lasts during at least one clock period. The clock and the level signal patterns are specified by commands preceding the clock and the level patterns, respectively. Thus, each command may be considered as a part of the input stimulation pattern.

The conventional control method is carried out in the following manner under control of a simulation processor included in the simulator. The input stimulation pattern is given to the logic circuit when the logic simulation is started. At a first step $S_1$, judgement is made to determine whether the input stimulation pattern specifies either the level signal pattern or the clock signal pattern. When the level signal pattern is specified by the input stimulation pattern, the first step $S_1$ proceeds to a second step $S_2$. At the second step $S_2$, a selected one of logic signal sets is given as the input stimulation pattern to the input terminals of the logic circuit and may be called a primary logic signal.

On the other hand, when the clock signal pattern is specified by the input stimulation pattern, the first step $S_1$ is followed by a third step $S_3$ at which the clock terminal is supplied with a clock signal varied with time within each clock period. More particularly, each clock period defines a simulation period and is divided, for example, into first through third partial intervals. The clock signal takes either a logic "0" level or a logic "1" level at a time and has the logic "0," "1," and "0" levels during the first through third partial intervals, respectively. Thus, the clock signal is represented by a sequence of logic signals which may be referred to as an additional logic signal. From this fact, it is readily understood that the clock signals may be processed, like the level signals.

After the second or third step $S_2$ or $S_3$, the primary or the additional logic signal is subjected as a current logic signal to common processing. A fourth step $S_4$ therefore follows either the second step $S_2$ or the third step $S_3$. At the fourth step $S_4$, the primary or the additional logic signal is compared with a previous logic signal which is previously given to each of the input terminals or the clock terminal. Such comparison is made in connection with each input or clock terminal.

Coincidence between the current and the previous logic signals shows that a similar operation has already been carried out in response to the previous logic signal. On the other hand, non-coincidence between the current and the previous logic signals means that a novel operation must be carried out in connection with the current logic signal by designating the logic elements that is given the current logic signal and that may be referred to as a destined logic element.

When the current logic signal is non-coincident with the previous logic signal, the fourth step $S_4$ is followed by a fifth step $S_5$. At the fifth step $S_5$, the destined logic element is registered as one of registered logic elements in the simulation table in correspondence to each of the input or clock terminals at which the non-coincidence is detected.

On the other hand, the fourth step $S_4$ proceeds to a sixth step $S_6$ when the current logic signal is coincident with the previous logic signal. Likewise, the fifth step $S_5$ also proceeds to the sixth step $S_6$. At the sixth step $S_6$, a single one of the registered logic elements is selected from the simulation table to calculate an output logic signal in connection with the single one of the registered logic elements. The output logic signal may be called a current output logic signal.

At a seventh step $S_7$, a determination is made as to whether or not the current output logic signal is coincident with a previous output logic signal which has previously been calculated in connection with the single one of the registered logic elements in question.

When non-coincidence is detected between the current and the previous output logic signals, the seventh step $S_7$ is followed by an eighth step $S_8$. Otherwise, the seventh step $S_7$ proceeds to a ninth step $S_9$.

At the eighth step $S_8$, the current output logic signal is kept as a new output logic signal of the logic element in question in the simulation table. Thereafter, registration of the logic element in question is removed from the simulation table. Instead, a next following one of the destined logic elements is registered in the simulation table.

When coincidence is detected between the current and the previous output logic signals at the seventh step $S_7$, registration of the logic element in question is deleted from the simulation table at the ninth step $S_9$.

Each of the eighth and the ninth steps $S_8$ and $S_9$ proceeds to a tenth step $S_{10}$ at which detection is made about the presence or absence of the registered logic elements remaining in the simulation table. If the remaining registered logic elements are present in the simulation table, operation is turned from the tenth step $S_{10}$ back to the sixth step $S_6$. As a result, the sixth through tenth steps $S_6$ to $S_{10}$ are repeated until the remaining registered logic elements come to naught.

If the remaining registered logic elements are absent in the simulation table, the tenth step $S_{10}$ is followed by an eleventh step $S_{11}$ at which each of the circuit output signals are observed at the output terminals.

Thereafter, a twelfth step $S_{12}$ is carried out to judge whether the input stimulation pattern is completed or not. If the input stimulation pattern remains, the twelfth step $S_{12}$ is followed by the first step $S_1$ so as to continue the above-mentioned operation. Otherwise, the operation comes to an end.

A similar operation is carried out even when a scan-path or a shift register string is formed through the sequential circuits in the logic circuit so as to supply the shift register string with a serial input signal which is given through a shift-in terminal. This is because such a serial input signal is dealt with as the logic signal. More specifically, the first through tenth steps $S_1$ to $S_{10}$ must be executed each time when each logic signal of the serial input signal is given to the shift-in terminal until the serial input signal is finally set in the shift register string. For example, let the serial input signal have a pattern of "101" arranged from the most significant bit to the least significant one in order and be finally set in the shift register string of three stages. The first through tenth steps $S_1$ to $S_{10}$ are repeatedly executed in response to each bit of the pattern. It is to be noted that such execution becomes valid only when the pattern of "101" is set in the three stages of the shift register string.

In addition, the shift register string must be observed at the eleventh step $S_{11}$ by carrying out a shift-out operation, namely, serial shift operation one by one to extract the contents from the shift register string.

Under the circumstances, the logical simulation becomes undesirably long when the shift register string is formed in the logic circuit.

Figure 2:
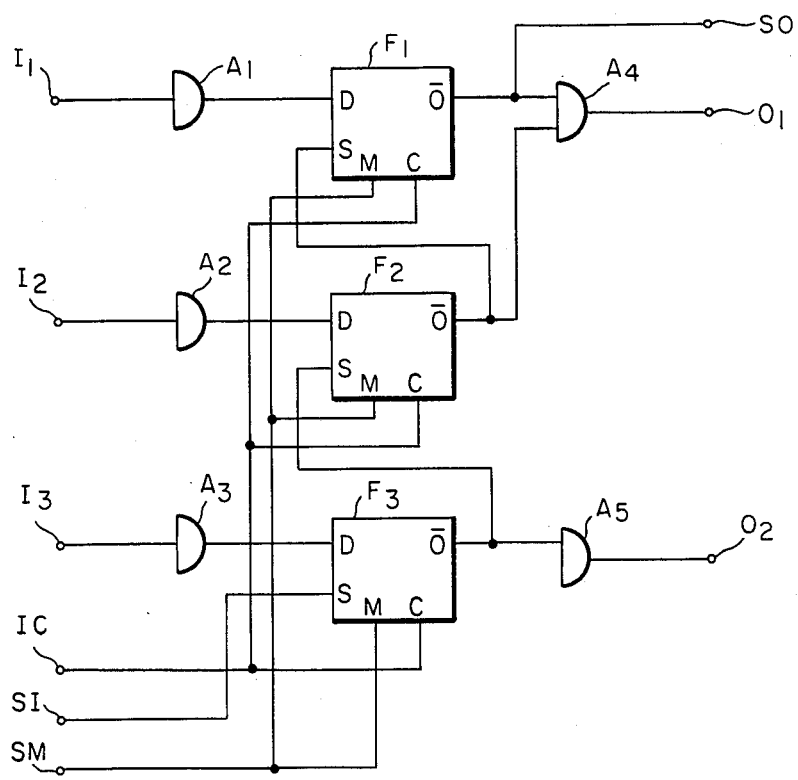
FIG. 2 shows a block diagram of a logic circuit exemplified to describe the logical simulation in detail.
Figure 3:
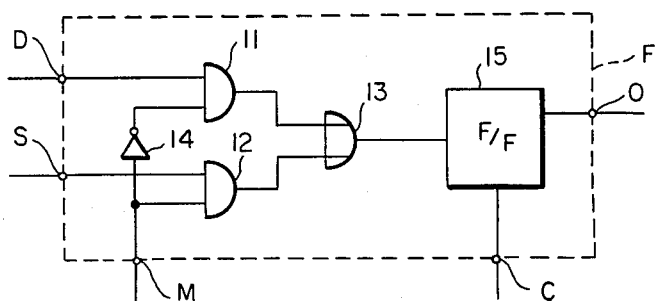
FIG. 3 shows a block diagram of a logic element used in the logic circuit illustrated in FIG. 2.

Referring to FIGS. 2 and 3, the logical simulation will be described in more detail by the use of a logic circuit, although it is understood that such a logical simulation is carried out in the simulator. The logic circuit has first through third input terminals $I_1$, $I_2$, and $I_3$, a clock terminal IC, a shift-in terminal SI, and a shift mode control terminal SM. The logic circuit further has first and second output terminals $O_1$ and $O_2$ and a shift-out terminal SO. The illustrated logic circuit comprises first through third AND gates $A_1$, $A_2$, and $A_3$ connected to the first through third input terminals $I_1$ to $I_3$, respectively, and first through third flip flops $F_1$ to $F_3$ connected to the first through third AND gates $A_1$ to $A_3$, respectively.

The flip flops $F_1$ to $F_3$ have data terminals D connected to the first through third AND gates $A_1$ to $A_3$, respectively, clock input terminals C connected to the clock terminal IC in parallel, and mode terminals M connected to the shift mode control terminal SM in parallel. In addition, the shift-in terminal SI is connected to a shift terminal S of the third flip flop $F_3$ which has a data output terminal O connected to a shift terminal S of the second flip flop $F_2$. A data output terminal O of the second flip flop $F_2$ is connected to a shift terminal S of the first flip flop $F_1$ while a data output terminal O of the first flip flop $F_1$ is connected to the shift-out terminal SO and connected to a fourth AND gate $A_4$ together with the data output terminal O of the second flip flop $F_2$. The data output terminal O of the third flip flop $F_3$ is connected to a fifth AND gate $A_5$. The fourth and fifth AND gates $A_4$ and $A_5$ are connected to the first and the second output terminals $O_1$ and $O_2$, respectively.

In FIG. 3, each of the first through third flip flops depicted at F comprises a pair of AND circuits 11 and 12 connected to the data input terminal D and the shift terminal S, respectively, and an OR gate 13 connected to the AND circuits 11 and 12. The AND gates 11 and 12 are switched from one to another by an inverter 14 connected to the mode terminal M. The OR gate 13 is connected to a flip flop element 15 which is controlled by a sequence of clock signals given through the clock input terminal C and which produces an element output signal through the data output terminal O.

It is assumed that the illustrated logic circuit is simulated under control of the conventional control method and that the input stimulation pattern of (0, 1, 0) is given to the first through third input terminals $I_1$ to $I_3$, respectively, and may be called a first pattern. In FIGS. 1 and 2, the first pattern of (0, 1, 0) is set to the first through third input terminals $I_1$ to $I_3$ at the first step $S_1$ and is different from an initial pattern set in the first through third input terminals $I_1$ to $I_3$ (e.g. step 54). Therefore, the destined logic elements, namely, the first through third AND gates $A_1$ to $A_3$ are registered in the simulation table at the fifth step $S_5$. At the sixth step $S_6$, an output signal of the first AND gate $A_1$ is calculated and is different from an initial value thereof. Therefore, the seventh step $S_7$ is followed by the eighth step $S_8$ at which the first AND gate $A_1$ is deleted from the simulation table. Instead, the first flip flop $F_1$ is registered in the simulation table. A similar operation is repeated in connection with the second and third AND gates $A_2$ and $A_3$.

Inasmuch as no clock signal is given to the clock terminal IC, output values of the first through third flip flops $F_1$ to $F_3$ are indefinite.

Subsequently, let the shift-in terminal SI be successively supplied with a serial input pattern of (1, 0, 1) with the first through third input terminals $I_1$ to $I_3$ kept unchanged. In this event, the first through third input terminals $I_1$ to $I_3$, the clock terminal IC, the shift-in terminal SI, and the shift mode control terminal SM are at first given a first pattern of (0, 1, 0, 0, 1, 1) as the input stimulation pattern, respectively. Thus, a first one of the serial input pattern is given to the shift-in terminal SI with the shift mode control terminal SM supplied with the logic "1" level.

Under the circumstances, the clock signal successively takes "0," "1," and "0" levels. Simulation is carried out in the manner described in conjunction with the pattern of (0, 1, 0) each time when the clock signal is varied. The logic "1" level is stored in the third flip flop $F_3$ through the shift-in terminal SI.

Thereafter, a second one ("0") of the serial input pattern is changed from the first pattern and supplied to the shift-in terminal SI. Such a pattern may be called a second pattern. The second pattern is therefore represented by (0, 1, 0, 0, 0, 1) in a manner similar to the first pattern. The clock signal is changed in the above-mentioned manner so as to carry out the simulation in the manner described before. As a result, the second and third flip flops $F_2$ and $F_3$ are loaded with the logic "1" level and the logic "0" levels, respectively.

The second pattern is changed to a third pattern which includes a third one ("1") of the serial input pattern and which is represented by (0, 1, 0, 0, 1, 1). Under the circumstances, the above-mentioned simulation is repeated by changing the clock signal. Thus, the first through third flip flops $F_1$ to $F_3$ are finally loaded with the logic "1," "0," and "1" levels, respectively.

Thus, the simulation is also carried out before the serial input pattern is finally stored in the shift register string formed by the first through third flip flops $F_1$ to $F_3$.

Figure 4:
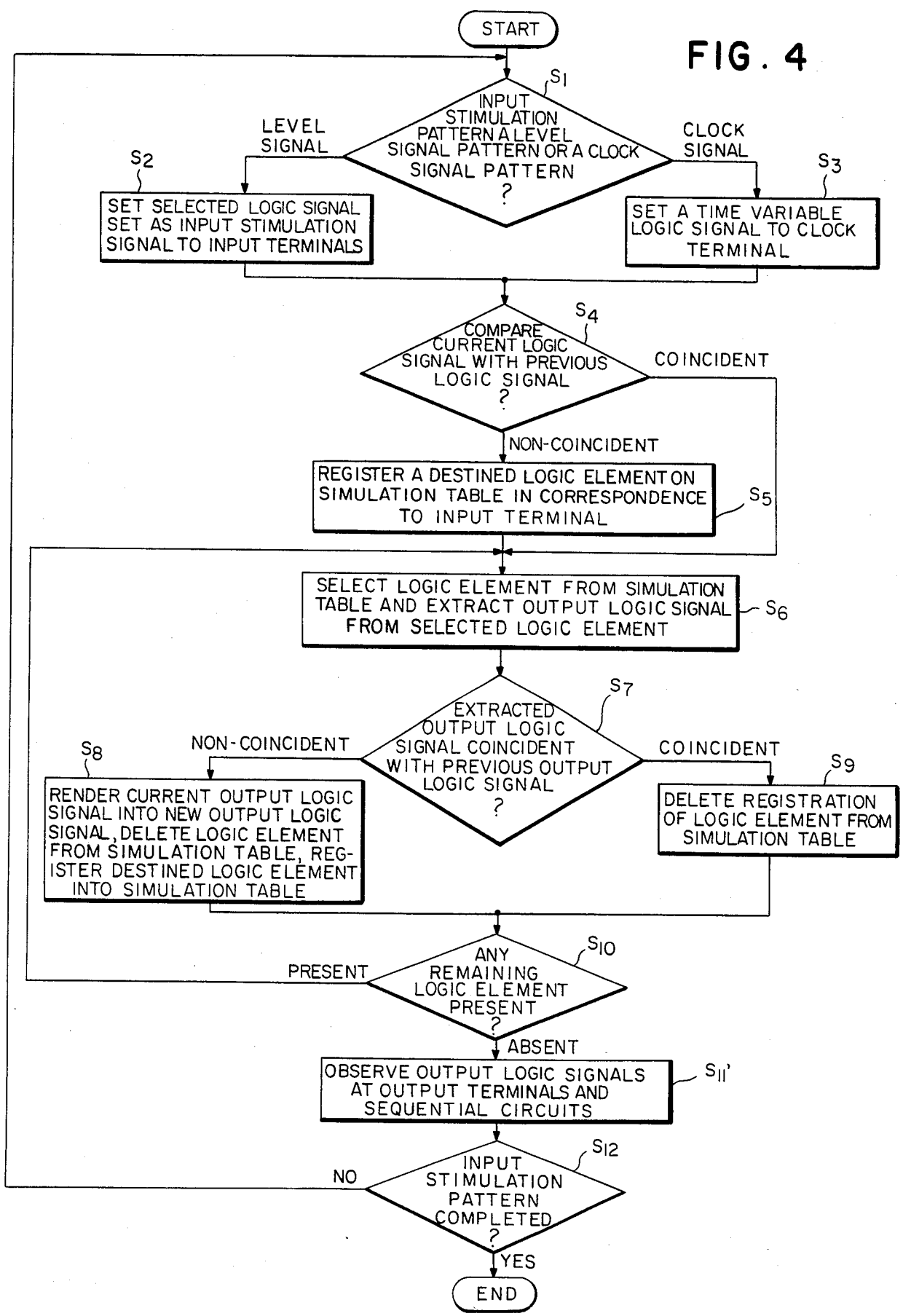
FIG. 4 shows a flow chart for use in describing a control method according to a first embodiment of this invention.

Referring to FIG. 4, a control method according to a first embodiment of this invention is similar to that illustrated in FIG. 1 insofar as the first through the tenth steps $S_1$ to $S_{10}$ are carried out in the manner described above. The control method being illustrated, differs from that described with reference to FIG. 1, in that sequential circuits, such as flip flops and/or registers, included in the logic circuit are directly observed together with the output terminal set at an eleventh step $S_{11}'$ without any serial shift operation. This is because internal states of the sequential circuits can be directly monitored on the simulation table when the shift register string is formed in the logic circuit. For this purpose, the simulation table is accessed to access addresses corresponding to the output terminal set and the sequential circuits.

As mentioned before, the eleventh step $S_{11}'$ serves to extract an output signal set from the output terminal set and the sequential circuits without the shift-out operation and may be called an extraction step. In this connection, the fourth through tenth steps $S_4$ to $S_{10}$ (FIG. 1) will be called a driving step for driving the logic circuit.

Thus, no serial shift operation is necessary in the control method illustrated in FIG. 4 on monitoring the output signal set, although such serial shift operation is carried out when a serial input signal is shifted into the shift register string. Accordingly, it is possible to save time for monitoring the output signal set.

Referring to FIG. 5, a control method according to a second embodiment of this invention is for use in combination with the logic circuit mentioned in conjunction with FIGS. 2 and 3 and is similar to that illustrated in FIG. 4 except that first through fourth novel steps $Sa_1$, $Sa_2$, $Sa_3$, and $Sa_4$ are substituted for the first through third steps $S_1$ to $S_3$ described in conjunction with FIG. 4. Specifically, the logic circuit comprises, together with combinational circuits, sequential circuits which can be simulated by forming a shift register string or scan-path. As a result, the logic circuit has an input terminal set, an output terminal set, a clock terminal, and a shift-in terminal like in FIGS. 2 and 3. In the example being illustrated, the input stimulation pattern is divisible into a level signal pattern, a clock signal pattern, and a shift-in pattern which is loaded with the shift register string. In other words, the shift-in pattern is distinguished from the level signal pattern and the clock signal pattern and may be called a scan-in pattern. The shift-in, the level signal, and the clock signal patterns are specified by commands therefor, respectively.

In FIG. 5 a determination is made at the first novel step $Sa_1$ to determine that the input stimulation pattern specifies either one of the level signal pattern, the clock signal pattern, and the shift-in pattern. The determination is possible by monitoring each command. The input stimulation signal is given to the logic circuit to access the same for the logical simulation. Therefore, the first novel step $Sa_1$ will be called a step for accessing the logic circuit.

When the input stimulation pattern is the shift-in pattern, the first novel step $Sa_1$ is followed by the second novel step $Sa_2$ at which the shift-in pattern is directly set in the sequential circuits on the simulation table without the shift-in operation, namely, serial shift operation.

Referring to FIG. 2 again together with FIG. 4, it is assumed that the logical simulation is carried out in relation to the logic circuit illustrated in FIG. 2. Specifically, the simulation table has a plurality of addresses for the respective elements, such as the first through fifth AND gates $A_1$ to $A_5$, the first through third flip flops $F_1$ to $F_3$. Let the shift-in pattern have a pattern of bits "1, 0, 1" which will be called first, second, and third bits, respectively, and which are stored in the first through third flip flops $F_1$ to $F_3$, respectively.

Under the circumstances, the first through third bits are set in those addresses of the simulation table which are assigned to the first through third flip flops $F_1$ to $F_3$, respectively. This is equivalent to the fact that the first through third bits (1, 0, 1) are directly set in the respective first through third flip flops $F_1$ to $F_3$ without the serial shift operation.

From this fact, it is to be understood that the control method of controlling the logical simulation is progressive in a manner different from logical simulation of a logic circuit.

When the input stimulation signal specifies the level signal, the first novel step $Sa_1$ proceeds to the third novel step $Sa_3$ at which the input terminal set is given logic signals of the input stimulation pattern. The third novel step $Sa_3$ is similar to the second step $S_2$ mentioned in conjunction with FIG. 1.

In addition, the first novel step $Sa_1$ is followed by the fourth novel step $Sa_4$ which is similar to the third step $S_3$ of FIG. 1. At any rate, the clock terminal is given a sequence of clock signals variable with time.

Subsequently, each of the second through fourth novel steps $Sa_2$ to $Sa_4$ is followed by the afore-described fourth step $S_4$. At the fourth step $S_4$, comparison between the current and the previous logic signals is made about the input terminal set and the sequential circuits. Destined logic elements are registered on the simulation table in connection with the input terminal set and the sequential circuits. Thereafter, the shift-in, the level signal, and the clock signal patterns are subjected to processing in a manner similar to that described with reference to FIG. 1 so as to make the logic circuit carry out the logical simulation.

In addition, the output logic signals of the sequential circuits and the output terminal set are observed at the eleventh step $S_{11}'$ in a manner similar to that described in FIG. 4. Such observation is carried out with reference to the simulation table and therefore makes the shift-out operation useless during the logical simulation.

Under the circumstances, procedures between the second through fourth novel steps $Sa_2$ to $Sa_4$ and the twelfth step $S_{12}$ serve to control operation of the logic elements and may collectively be called a control step for controlling the logic elements without the serial shift operation.

According to the control method illustrated with reference to FIG. 5, the serial shift operation becomes unnecessary at the second novel step $Sa_2$ and the eleventh step $S_{11}'$. Therefore, it is possible to considerably improve a simulation speed.

Figure 6:
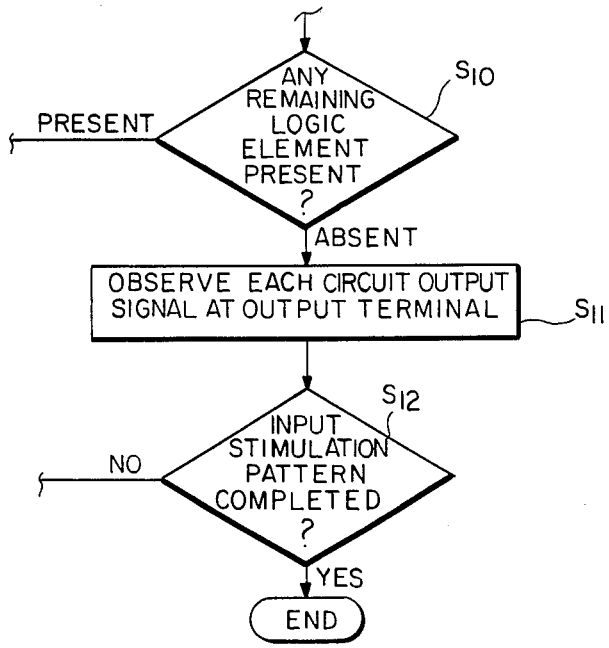
FIG. 6 shows a flow chart for use in describing a control method according to a third embodiment of this invention.

Referring to FIG. 6, a control method according to a third embodiment of this invention is similar to that illustrated in FIG. 5 as regards the first through the fourth novel steps $Sa_1$ to $Sa_4$ and the above-mentioned fourth through tenth steps $S_4$ to $S_{10}$. The method being illustrated, differs from that illustrated in FIG. 5 in that only the output terminal set is observed at an eleventh step $S_{11}$ in a manner similar to that illustrated in FIG. 1. In other words, the shift-out operation is carried out at the eleventh step so as to extract internal states from the shift register string.

However, the sequential circuits are directly loaded with the logic signals at the second additional step $Sa_2$ (FIG. 5). Accordingly, it is possible for the control method (FIG. 6) to shorten the time for the logical simulation and to improve the simulation method.

What is claimed is:

1. A method of controlling a logical simulation of a logic circuit comprising a plurality of logic elements which can be simulated by forming a shift register string which is capable of carrying out a serial shift operation, said logical simulation being progressive in accordance with a simulated table on which said logic elements are described, said method comprising the steps of:
   providing an input stimulation signal for accessing said logic circuit; and
   controlling operation of said logic elements by the use of said simulation table said controlling step including the step of directly setting said input stimulation signal into said logic elements on said simulation table without said serial shift operation to make said logic circuit carry out said logical simulation.

2. A method as claimed in claim 1, said logic circuit having an output terminal set which is related to said logic elements, wherein:
   said providing step comprises the steps of:
   preparing a clock signal pattern of clock signals repeated at every clock period and a level signal pattern of level signals lasting during at least each clock period;
   detecting whether said input stimulation signal specifies said clock signal pattern or said level signal pattern; and
   setting said level signals in said shift register string by carrying out said serial shift operation for said logical simulation when said level signal pattern is specified by said input stimulation signal;
   said controlling step comprising the steps of:
   driving said logic circuit in accordance with said input stimulation signal to make said logic circuit carry out said logical simulation by directly setting said input stimulation signal into said logic elements on said simulation table; and
   extracting an output signal set in response to said input stimulation signal from said output terminal set and said logic elements without said serial shift operation.

3. A method as claimed in claim 1, said logic circuit having an output terminal set which is related to said logic elements, wherein said providing step comprises the steps of:
   preparing a clock signal pattern of clock signals repeated at every clock period, a level signal pattern of level signals lasting during at least each clock period, and a shift-in pattern of shift-in signals which are to be set in said shift register string; and detecting that said input stimulation pattern is either one of said clock signal pattern, said level signal pattern, and said shift-in pattern;
said controlling step comprising the steps of:
setting said shift-in signals in said shift register string on said simulation table without said serial logic operation when said shift-in pattern is specified by said input stimulation signal; and
producing an output signal set resulting from said shift-in signals by making said logic circuit carry out said logical simulation.

4. A method as claimed in claim 3, wherein said producing step comprises the steps of:
making said logic circuit process said logical simulation by the use of said shift-in signals; and
extracting said output signal set from said logic circuit without said serial shift operation.

5. A method as claimed in claim 3, wherein said producing step comprises the steps of:
making said logic circuit process said logical simulation by the use of said shift-in signals; and
deriving said output signal set from said logic circuit by carrying out said serial shift operation.

* * * * *